(12) United States Patent
Nagano

(10) Patent No.: US 7,741,590 B2
(45) Date of Patent: Jun. 22, 2010

(54) IMAGE SENSOR AND IMAGE SENSING APPARATUS COMPRISING WAVEGUIDE AND MULTILAYER WIRING STRUCTURE

(75) Inventor: Akihiko Nagano, Ichihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/425,484

(22) Filed: Apr. 17, 2009

(65) Prior Publication Data

US 2009/0266975 A1 Oct. 29, 2009

(30) Foreign Application Priority Data

Apr. 28, 2008 (JP) .............................. 2008-117627

(51) Int. Cl.
H01L 31/0232 (2006.01)
G02B 6/12 (2006.01)
(52) U.S. Cl. ..................... 250/208.1; 257/292; 438/59
(58) Field of Classification Search .............. 250/208.1; 257/292; 438/59
See application file for complete search history.

(56) References Cited

U.S. PATENT DOCUMENTS 7,442,973 B2 10/2008 Komoguchi et al.

2008/0135732 A1* 6/2008 Toumiya et al. .......... 250/208.1

FOREIGN PATENT DOCUMENTS

JP 2004-221532 8/2004

* cited by examiner

*Primary Examiner*—Seung C Sohn
(74) *Attorney, Agent, or Firm*—Cowan, Liebowitz & Latman, P.C.

(57) ABSTRACT

An image sensor comprises a photoelectric conversion unit; a transfer transistor which has a gate electrode; a multilayer wiring structure which defines an aperture region above the photoelectric conversion unit; and a waveguide which guides light entering the aperture region to the light receiving surface, wherein the multilayer wiring structure includes a first wiring layer which is an uppermost wiring layer and defines two contour sides of the aperture region in a first direction, and a second wiring layer which is arranged between the gate electrode and the first wiring layer in a direction perpendicular to the light receiving surface, and defines two contour sides of the aperture region in a second direction, and wherein the gate electrode is arranged to overlap part of the light receiving surface and have a longitudinal direction along the first direction.

6 Claims, 12 Drawing Sheets

IMAGE SENSOR AND IMAGE SENSING APPARATUS COMPRISING WAVEGUIDE AND MULTILAYER WIRING STRUCTURE

BACKGROUND OF THE INVENTION

1. Field of the Invention

The present invention relates to an image sensor and image sensing apparatus.

2. Description of the Related Art

Recently, image sensors used in image sensing apparatuses such as a digital still camera and high-quality video camera require a larger number of pixels in the pixel array. As the number of pixels of the pixel array increases, the image sensor sometimes reads out pixel signals from the pixel array via a plurality of channels in order to read them out at high speed.

Also, as the number of pixels of the pixel array increases, the size (area) of a pixel is sometimes decreased in the image sensor. In this case, the size (area) of an aperture region above a photodiode also decreases. Since the efficiency at which light entering a microlens reaches the light receiving surface of the photodiode decreases, the photodiode may have lower sensitivity.

According to a technique disclosed in Japanese Patent Laid-Open No. 2004-221532, a waveguide formed of a transparent material higher in refractive index than an interlayer insulation film is arranged between the light incident surface (microlens) of an image sensor and a photoelectric conversion unit (photodiode) in a solid-state image sensor. The width of the waveguide on the side of the light incident surface is larger than that on the side of the photoelectric conversion unit. According to Japanese Patent Laid-Open No. 2004-221532, this structure facilitates total reflection of light entering the waveguide by the interface between the waveguide and the interlayer insulation film. Hence, this technique can increase the efficiency at which light entering the microlens reaches the light receiving surface of the photodiode.

An example of the structure of each pixel in the pixel array of an image sensor 1 will be explained with reference to FIGS. 8 to 12. FIG. 8 is a plan view showing the layout of each pixel in the image sensor 1. FIG. 9 is a sectional view (sectional view in the x direction) taken along the line A-A in FIG. 8. FIG. 11 is a sectional view (sectional view in the y direction) taken along the line B-B in FIG. 8. In the following description, the x direction is the long-side direction of the pixel array, and the y direction is the short-side direction of the pixel array. However, it is also possible that the x direction is the short-side direction of the pixel array, and the y direction is the long-side direction of the pixel array. FIGS. 10 and 12 are sectional views for explaining problems in the image sensor 1.

In the image sensor 1, a photoelectric conversion unit 11 is formed in a silicon substrate 10. A gate electrode 30 of a transfer transistor 12 for transferring charges generated in the photoelectric conversion unit (photodiode) 11 to a charge-voltage converter (floating diffusion) is arranged at a position where the gate electrode 30 overlaps part of a light receiving surface 11a of the photoelectric conversion unit 11.

A first interlayer insulation film 21 formed of silicon oxide is arranged on the photoelectric conversion unit 11. A second wiring layer 31 is arranged on the first interlayer insulation film 21. A first wiring layer 32 is arranged on a second interlayer insulation film 22. Further, a third interlayer insulation film 23 is arranged to cover the first wiring layer 32.

The first wiring layer 32 and second wiring layer 31 (a multilayer wiring structure 33) define an aperture region OR1 above the photoelectric conversion unit 11. The first wiring layer 32 defines two contour sides ORS3 and ORS4 of the aperture region OR1 in the first direction. The second wiring layer 31 defines two contour sides ORS1 and ORS2 of the aperture region OR1 in the second direction. In the aperture region OR1, an optical waveguide 40 formed of silicon nitride is arranged. The width of the optical waveguide 40 on the side of the light incident surface is larger than that on the side of the photoelectric conversion unit. A planarized layer 50, color filter layer 51, planarized layer 52, and on-chip lens 53 are formed of resin materials above the optical waveguide 40.

In the cross section along the x direction shown in FIG. 9, the first wiring layer 32 includes two lines 32a and 32b per pixel. The two lines 32a and 32b of the first wiring layer 32 are formed at an interval ORL1 as large as possible so as not to cut off light entering the photoelectric conversion unit 11. Considering the manufacturing margin, the optical waveguide 40 and each of the two lines 32a and 32b are formed apart from each other at a predetermined interval s1 or more. A width W1 of a top face 40a of the optical waveguide 40 is determined by subtracting double the predetermined interval s1 from the interval ORL1 between the two contour sides ORS3 and ORS4.

More specifically, assuming that the taper angle of a side face 40c of the optical waveguide 40 is set to a predetermined angle, a dead space DS1 defined by the two lines 32a and 32b is a hatched region shown in FIG. 10. As for the cross section along the x direction, the width W1 of the optical waveguide 40 can be increased to the boundary of the dead space DS1.

In the cross section along the y direction shown in FIG. 11, the second wiring layer 31 includes two lines 31a and 31b per pixel. The two lines 31a and 31b are formed at an interval ORL2 as large as possible so as not to cut off light entering the photoelectric conversion unit 11. As described above, the gate electrode 30 of the transfer transistor 12 is arranged at a position where it overlaps part of the light receiving surface 11a of the photoelectric conversion unit 11. The gate electrode 30 is formed of polysilicon which absorbs part of visible light, and is arranged not to overlap a bottom face 40b of the optical waveguide 40.

Assume that it is required to make the gate electrode 30 overlap the light receiving surface 11a of the photoelectric conversion unit 11 by a predetermined length OL1 when viewed from the top, in order to increase the efficiency at which charges are transferred from the photoelectric conversion unit 11 to the charge-voltage converter. In this case, the edge portion of the bottom face 40b of the optical waveguide 40 needs to be positioned closer to a normal PL by the predetermined length s1 than the gate electrode 30 in order to ensure the manufacturing margin. For this reason, the interval between the optical waveguide 40 and each of the two lines 31a and 31b becomes a length s2 larger than the length s1 determined in consideration of the manufacturing margin. A width W2 of the optical waveguide 40 in the y direction is determined by subtracting double a predetermined interval s3 from the interval ORL2 between the two contour sides ORS1 and ORS2.

More specifically, assuming that the taper angle of the side face 40c of the optical waveguide 40 is set to a predetermined angle, a dead space DS2 defined by the two lines 31a and 31b should have been downsized as represented by a hatched region in FIG. 12A. However, the presence of the gate electrode 30 increases the dead space to a dead space D3 hatched in FIG. 12B, generating a wasteful space WS shown in FIG. 12C with respect to the two lines 31a and 31b. As a result, the width W2 of the optical waveguide 40 is narrowed more than necessary. The width W2 of the optical waveguide 40 cannot be increased to the boundary of the dead space DS2. The aperture (area of the top face 40a) of the entrance of the optical waveguide 40 becomes small, decreasing the quantity of light reaching the photoelectric conversion unit 11. That is, the efficiency at which incident light reaches the light receiving surface of the photoelectric conversion unit decreases.

If the width W2 of the optical waveguide 40 is increased to the boundary of the dead space DS2 in the cross section along the y direction, the length by which the gate electrode 30 overlaps the light receiving surface 11a becomes much shorter than the predetermined length OL1. In this case, the efficiency at which charges are transferred from the photoelectric conversion unit 11 to the charge-voltage converter decreases.

SUMMARY OF THE INVENTION

It is an aim of the present invention to suppress a decrease in efficiency at which charges are transferred from a photoelectric conversion unit to a charge-voltage converter, and suppress a decrease in efficiency at which incident light reaches the light receiving surface of the photoelectric conversion unit.

According to the first aspect of the present invention, there is provided an image sensor comprising: a photoelectric conversion unit having a light receiving surface; a transfer transistor which has a gate electrode and transfers charges generated in the photoelectric conversion unit to a charge-voltage converter; a multilayer wiring structure which defines an aperture region above the photoelectric conversion unit; and a waveguide which guides light entering the aperture region to the light receiving surface, wherein the multilayer wiring structure includes a first wiring layer which is an uppermost wiring layer and defines two contour sides of the aperture region in a first direction, and a second wiring layer which is arranged between the gate electrode and the first wiring layer in a direction perpendicular to the light receiving surface, and defines two contour sides of the aperture region in a second direction, and wherein the gate electrode is arranged to overlap part of the light receiving surface and have a longitudinal direction along the first direction.

According to the second aspect of the present invention, there is provided an image sensing apparatus comprising: an image sensor according to the first aspect of the present invention; an optical system which forms an image on an image sensing surface of the image sensor; and a signal processing unit which processes a signal output from the image sensor to generate image data.

The present invention can suppress a decrease in efficiency at which charges are transferred from a photoelectric conversion unit to a charge-voltage converter, and suppress a decrease in efficiency at which incident light reaches the light receiving surface of the photoelectric conversion unit.

Further features of the present invention will become apparent from the following description of exemplary embodiments with reference to the attached drawings.

DESCRIPTION OF THE EMBODIMENTS

Figure 1:
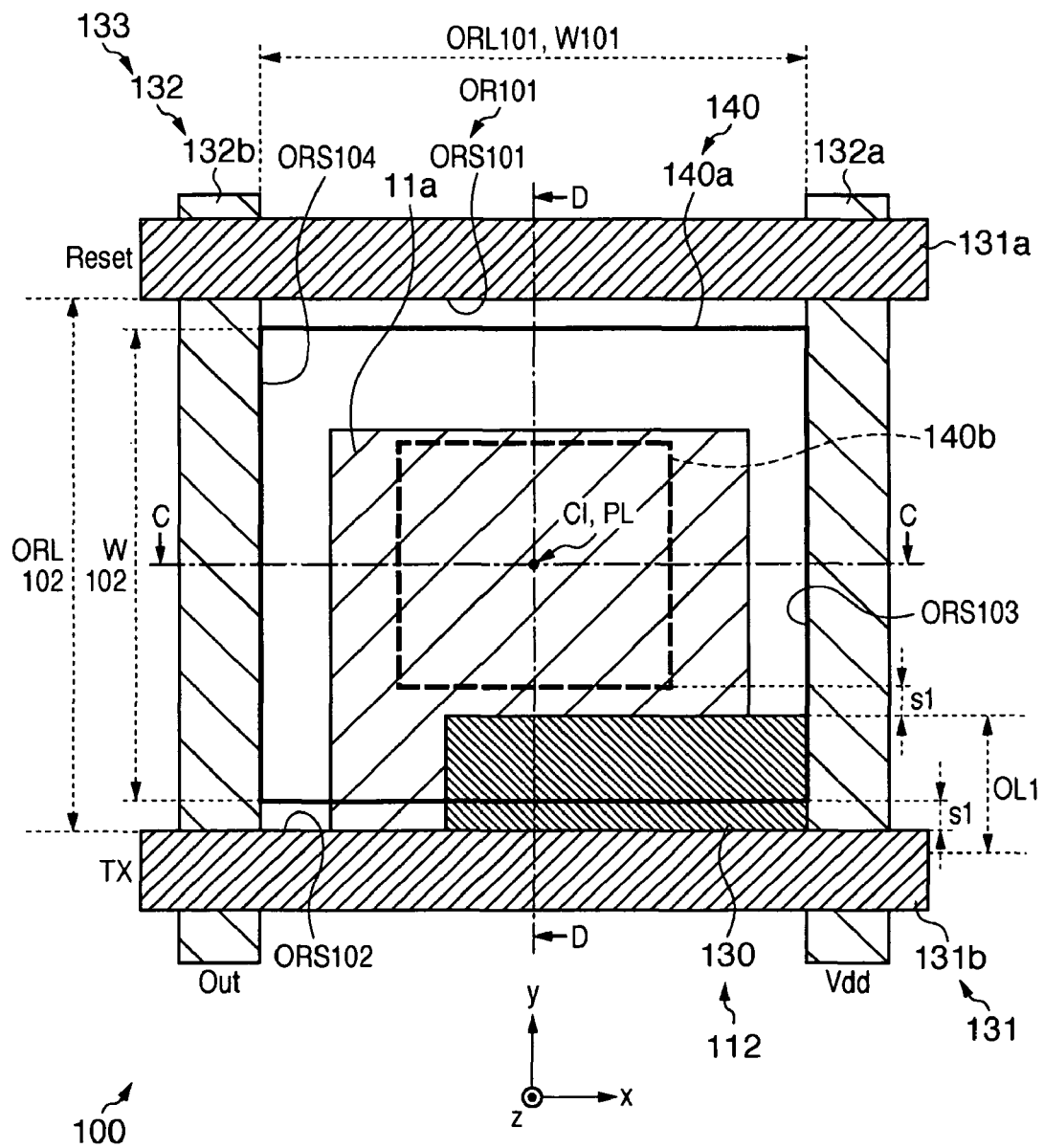
FIG. 1 is a plan view showing the layout of each pixel in the pixel array of an image sensor 100 according to the first embodiment of the present invention.
Figure 2:
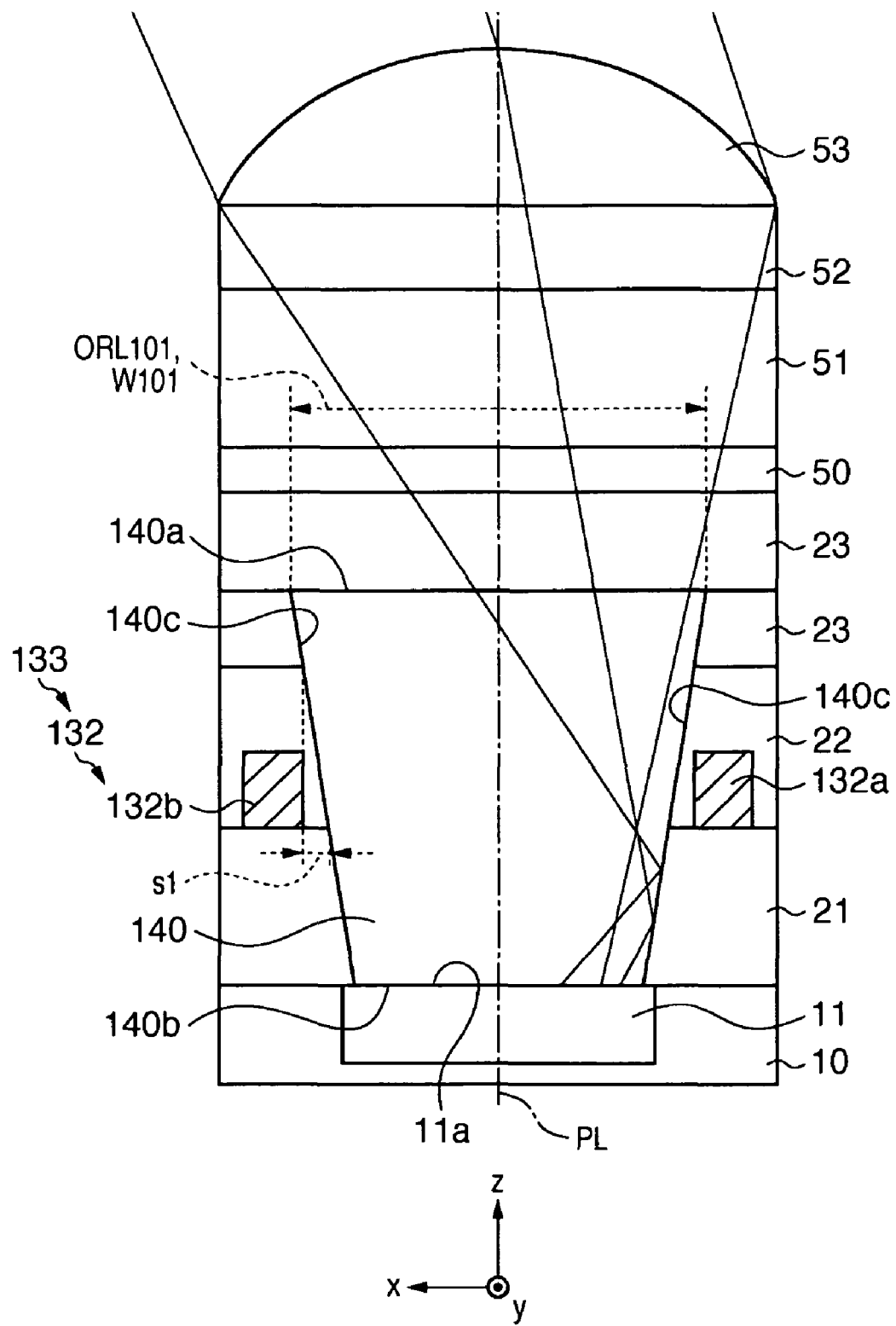
FIG. 2 is a sectional view taken along the line C-C in FIG. 1.
Figure 3:
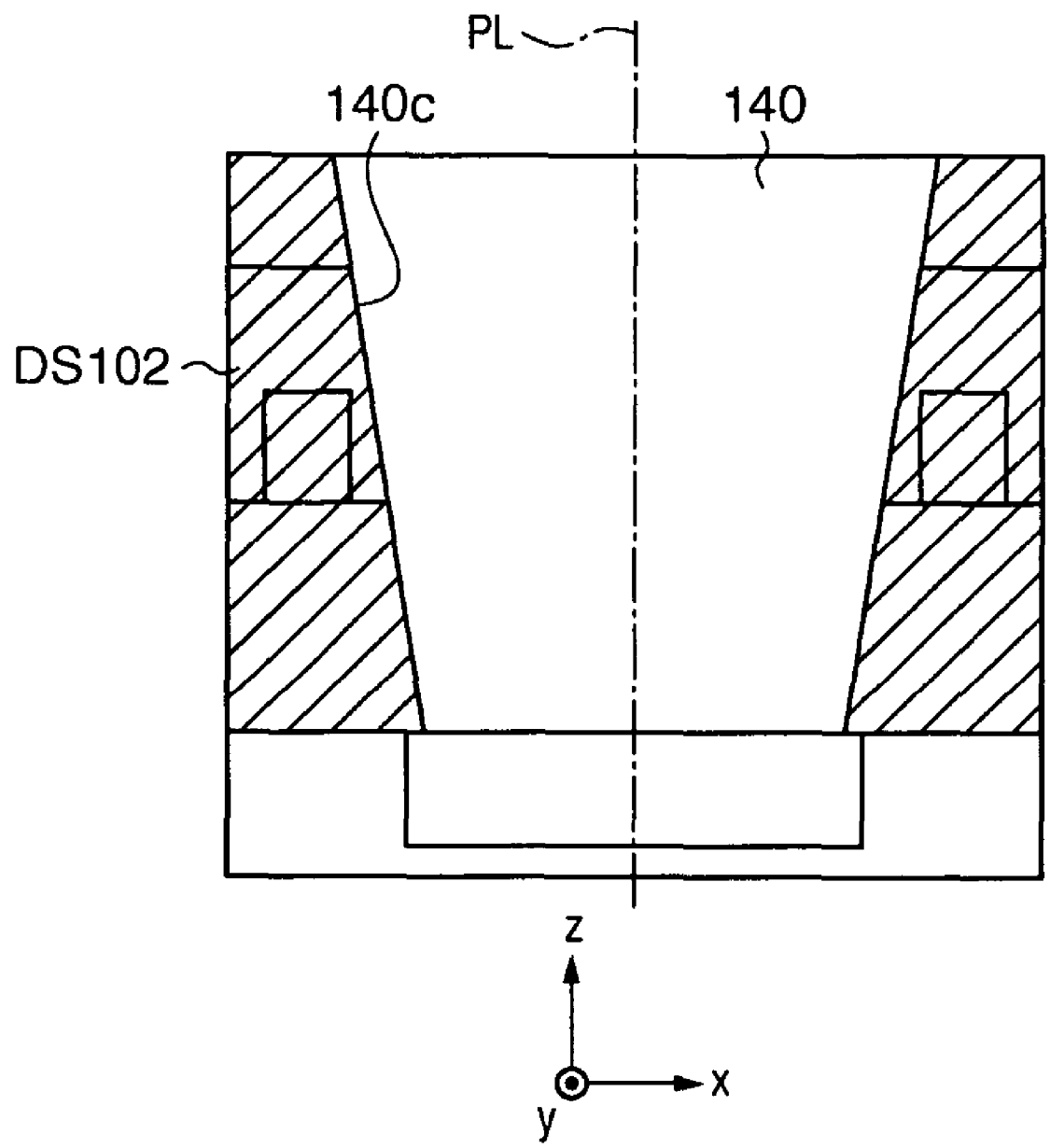
FIG. 3 is a sectional view for explaining a dead space in the section of FIG. 2.
Figure 4:
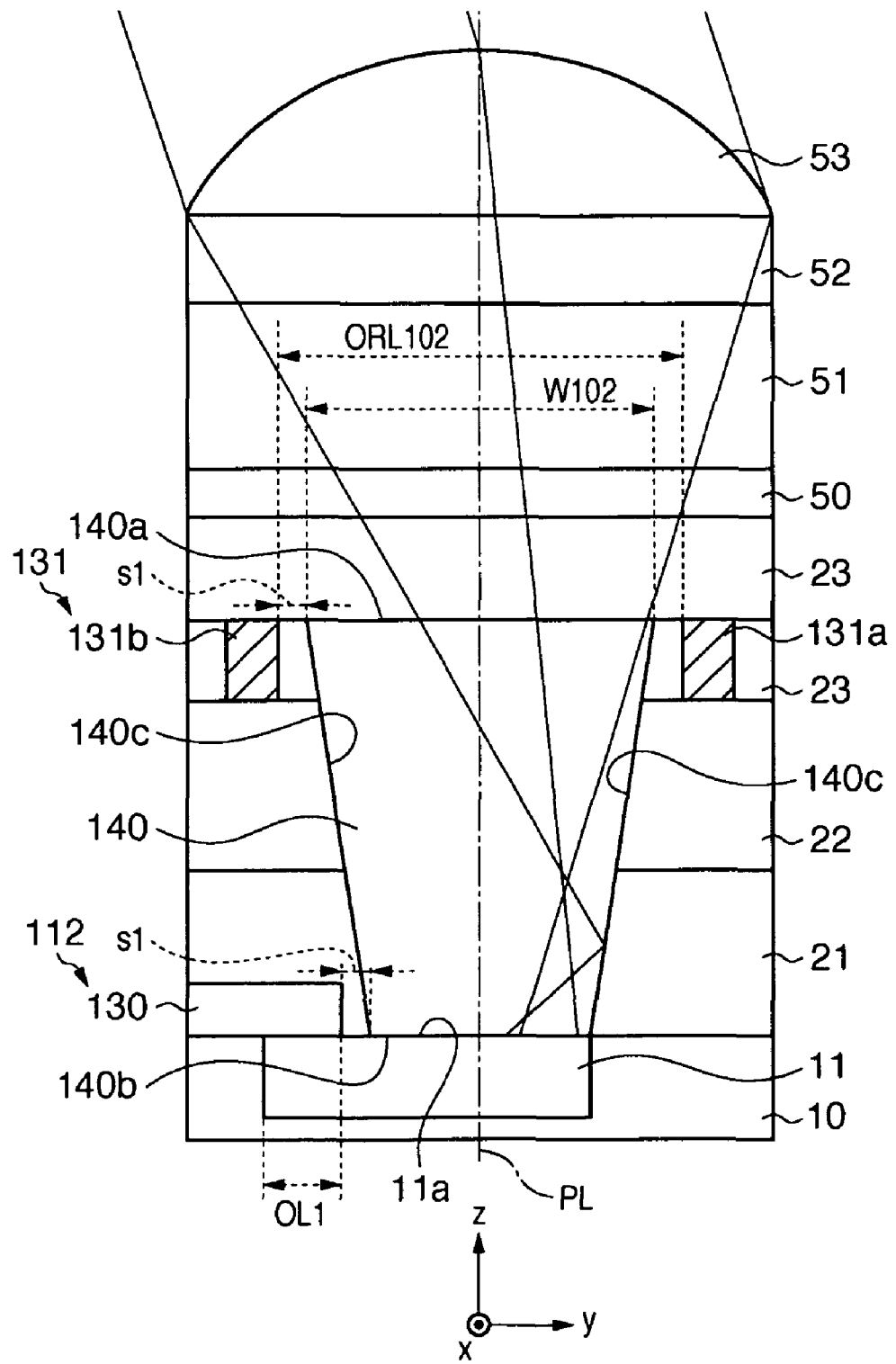
FIG. 4 is a sectional view taken along the line D-D in FIG. 1.
Figure 5:
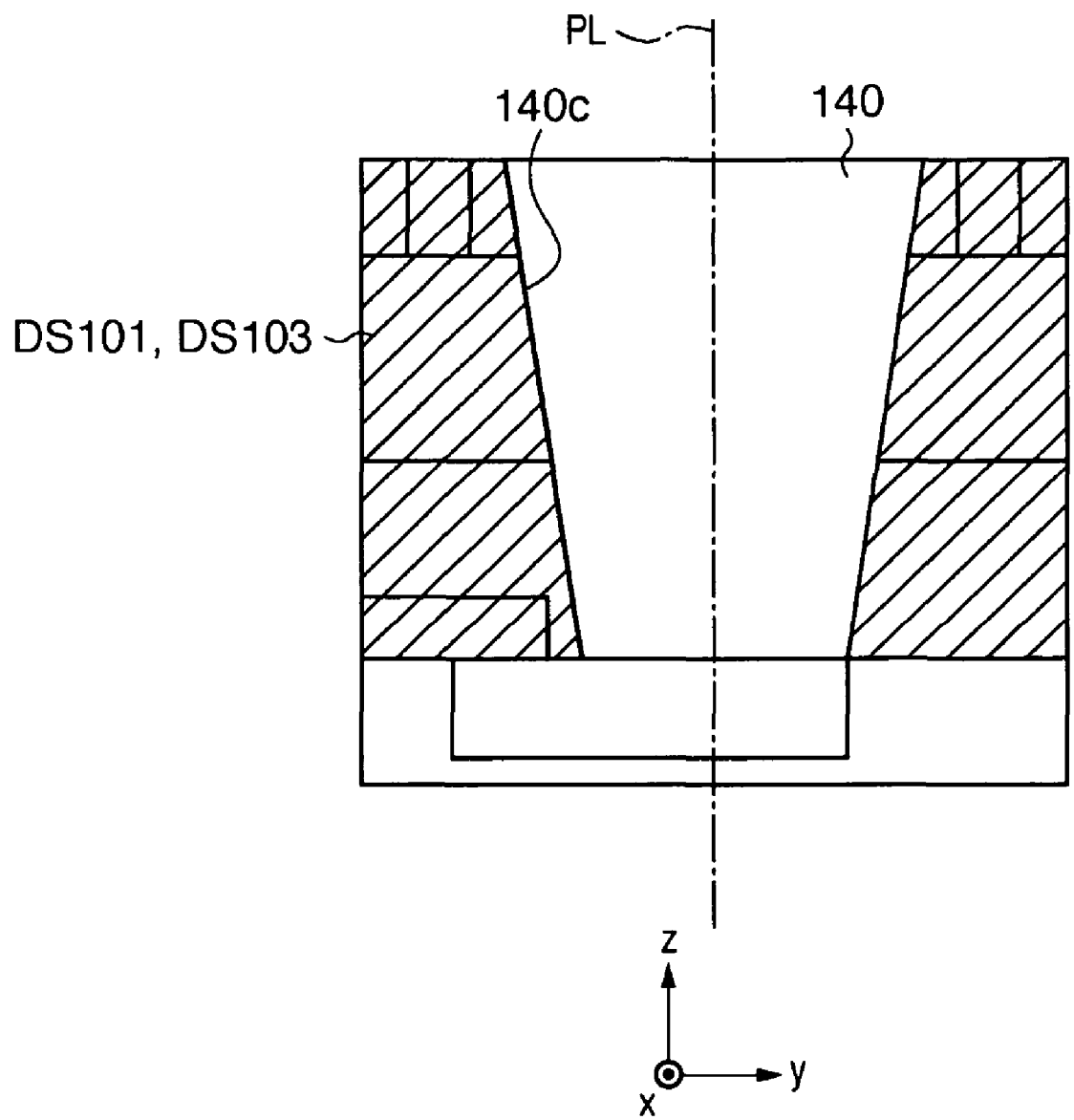
FIG. 5 is a sectional view for explaining a dead space in the section of FIG. 4.

An example of the structure of each pixel in the pixel array of an image sensor 100 according to the first embodiment of the present invention will be explained with reference to FIGS. 1 to 5. FIG. 1 is a plan view showing the layout of each pixel in the image sensor 100. FIG. 2 is a sectional view (sectional view in the x direction or z-x sectional view) taken along the line C-C in FIG. 1. FIG. 4 is a sectional view (sectional view in the y direction or z-y sectional view) taken along the line D-D in FIG. 1. In the following description, the x direction is the long-side direction of the pixel array, and the y direction is the short-side direction of the pixel array. However, it is also possible that the x direction is the short-side direction of the pixel array, and the y direction is the long-side direction of the pixel array. FIGS. 3 and 5 are sectional views for explaining features in the image sensor 100.

The image sensor 100 has a pixel array. In the pixel array, a plurality of pixels is arrayed two-dimensionally. Each pixel in the pixel array of the image sensor 100 includes a photoelectric conversion unit 11, charge-voltage converter (not shown), transfer transistor 112, multilayer wiring structure 133, and optical waveguide 140.

The photoelectric conversion unit 11 is formed in a silicon substrate 10. The photoelectric conversion unit 11 generates and accumulates charges corresponding to light. The photoelectric conversion unit 11 has a light receiving surface 11a. The photoelectric conversion unit 11 is, for example, a photodiode.

The charge-voltage converter is formed near the photoelectric conversion unit 11 in the silicon substrate 10. The charge-voltage converter converts charges into a voltage. The charge-voltage converter is, for example, a floating diffusion.

The transfer transistor 112 transfers charges generated in the photoelectric conversion unit 11 to the charge-voltage converter. The transfer transistor 112 is a MOS transistor which uses the photoelectric conversion unit 11 as a source region, has a gate electrode 130, and uses the charge-voltage converter as a drain region. The gate electrode 130 is arranged between the photoelectric conversion unit 11 and the charge-voltage converter when viewed from a direction perpendicular to the light receiving surface 11a. The gate electrode 130 is decentered in a −y direction from a center C1 of an aperture region OR101. When an active-level transfer signal is supplied to the gate electrode 130 via a transfer control line 131b (to be described later), the transfer transistor 112 is turned on to transfer charges generated in the photoelectric conversion unit 11 to the charge-voltage converter.

The multilayer wiring structure 133 defines the aperture region OR101 above the photoelectric conversion unit 11. The multilayer wiring structure 133 includes a first wiring layer 131, second wiring layer 132, and interlayer insulation films 21 and 22.

The first wiring layer 131 is an uppermost wiring layer, and defines two contour sides ORS101 and ORS102 of the aperture region OR101 in the x direction (first direction). The first wiring layer 131 is formed of a conductive material such as a metal or intermetallic compound mainly containing, for example, aluminum. The first wiring layer 131 includes a reset control line 131a and the transfer control line 131b. The reset control line 131a transfers a reset control signal "Reset" to be supplied to the gate electrode of a reset transistor (not shown) for resetting the charge-voltage converter in a pixel. The transfer control line 131b partially overlaps the gate electrode 130 when viewed from a direction (z direction) perpendicular to a normal PL. The transfer control line 131b transfers a transfer control signal "TX" to be supplied to the gate electrode 130 of the transfer transistor 112. The gate electrode 130 is formed of, for example, polysilicon. The transfer control line 131b and gate electrode 130 are connected via a plug (via plug) at a portion where they overlap each other when viewed from the direction (z direction) of the normal PL.

The second wiring layer 132 is arranged between the gate electrode 130 and the first wiring layer 131 in a direction along the normal PL passing through the center C1 of the aperture region OR101. The second wiring layer 132 defines two contour sides ORS103 and ORS104 of the aperture region in the y direction (second direction). The second wiring layer 132 is formed of a metal mainly containing, for example, aluminum. The second wiring layer 132 includes a power supply line 132a and column signal line 132b. The power supply line 132a supplies a power "Vdd" to the reset transistor or an amplification transistor (not shown) for outputting a signal corresponding to the voltage of the charge-voltage converter in a pixel to the column signal line 132b. The column signal line 132b transfers a pixel signal "Out" output from the amplification transistor in a pixel in accordance with the voltage of the charge-voltage converter.

The interlayer insulation film 21 is arranged between the photoelectric conversion unit 11 and the second wiring layer 132 along a normal PL (when viewed in the cross section). The interlayer insulation film 22 is arranged between the first wiring layer 131 and the second wiring layer 132 along a normal PL (when viewed in the cross section). An interlayer insulation film 23 is arranged to cover the first wiring layer 131. The interlayer insulation films 21, 22, and 23 are formed of, for example, a silicon oxide film, and has a refractive index of about 1.46.

The optical waveguide 140 guides light to pass through the aperture region OR101 and reach the photoelectric conversion unit 11. The optical waveguide 140 is formed of a material higher in refractive index than the interlayer insulation films 21, 22, and 23. The optical waveguide 140 is formed of, for example, a silicon nitride film and has a refractive index of about 1.9.

The width of the optical waveguide 140 on the side of the light incident surface is larger than that on the side of the photoelectric conversion unit. With this structure, the optical waveguide 140 can easily receive light from a top face 140a (increase the light receiving efficiency). The optical waveguide 140 includes the top face 140a arranged between the two contour sides ORS101 and ORS102 in the first direction, and a bottom face 140b arranged at a position where it does not overlap the gate electrode 130 within the top face 140a, when viewed from a direction perpendicular to the light receiving surface 11a. The top face 140a and bottom face 140b have, for example, a rectangular shape when viewed from a direction along the normal PL.

The optical waveguide 140 includes a side face 140c tapered from the edge portion of the top face 140a to that of the bottom face 140b to come close to the normal PL passing through the center C1 of the aperture region OR101, when viewed in the cross section. The side face 140c is in contact with the interlayer insulation films 21, 22, and 23. Part of light entering the optical waveguide 140 is totally reflected by the interface between the optical waveguide 140 and the interlayer insulation films 21, 22, and 23, that is, by the side face 140c, and is guided to the photoelectric conversion unit 11. The taper angle of the side face 140c with respect to the normal PL is set to an angle enough to totally reflect incident light efficiently. The taper angle of the side face 140c with respect to the normal PL is, for example, about 10°. This setting allows efficiently receiving light even when the angle of light entering an on-chip lens 53 is large.

A planarized layer 50 is arranged on the interlayer insulation film 23 on the light incident side of the optical waveguide 140 to provide a flat surface. A color filter layer 51 is arranged on the planarized layer 50. A planarized layer 52 is arranged on the color filter layer 51 to provide a flat surface. The on-chip lens 53 is arranged on the planarized layer 52. The on-chip lens 53 is arranged to ensure an imaging relationship between the exit pupil of a lens 92 (see FIG. 6: to be described later) and almost the center of the optical waveguide 140.

In the cross section along the x direction shown in FIG. 2, the second wiring layer 132 includes the two lines 132a and 132b per pixel. The two lines 132a and 132b are formed at an interval ORL101 as large as possible so as not to cut off light entering the photoelectric conversion unit 11. Considering the manufacturing margin, the optical waveguide 140 and each of the two lines 132a and 132b are formed apart from each other at a predetermined interval s1 or more. A width W101 of the top face 140a of the optical waveguide 140 equals the interval ORL101 between the two contour sides ORS103 and ORS104.

More specifically, assuming that the taper angle of the side face 140c of the optical waveguide 140 is set to a predetermined angle, a dead space DS102 defined by the two lines 132a and 132b is a hatched region shown in FIG. 3. As for the cross section along the x direction, the width W101 of the top face 140a of the optical waveguide 140 in the x direction can be increased to the boundary of the dead space DS102.

In the cross section along the y direction shown in FIG. 4, the first wiring layer 131 includes the two lines 131a and 131b per pixel. The two lines 131a and 131b are formed at an interval ORL102 as large as possible so as not to cut off light entering the photoelectric conversion unit 11. The gate electrode 130 is formed of polysilicon which absorbs part of visible light, and is arranged not to overlap the bottom face 140b of the optical waveguide 140. The gate electrode 130 of the transfer transistor 112 is arranged at a position where it overlaps part of the light receiving surface 11a of the photoelectric conversion unit 11. To efficiently transfer charges generated in the photoelectric conversion unit 11 to the charge-voltage converter, the gate electrode 130 and the light receiving surface 11a of the photoelectric conversion unit 11 need to overlap each other by a predetermined area or more.

Assume that it is required to make the gate electrode 130 overlap the light receiving surface 11a of the photoelectric conversion unit 11 by a predetermined length OL1 in the cross section along the y direction, in order to increase the efficiency at which charges are transferred from the photoelectric conversion unit 11 to the charge-voltage converter. In this case, the edge portion of the bottom face 140b of the optical waveguide 140 needs to be positioned closer to the normal PL by the predetermined length s1 than the gate electrode 130 in order to ensure the manufacturing margin.

Even in this case, the gate electrode 130 is arranged so that its longitudinal direction (its channel width direction) is along a direction in which the uppermost wiring layer extends, that is, the first direction (x direction). The gate electrode 130 is arranged at a position where it overlaps the first wiring layer 131 when viewed from a direction perpendicular to the light receiving surface 11a. Hence, even if the edge portion of the bottom face 140b of the optical waveguide 140 is positioned closer to the normal PL by the predetermined length s1 than the gate electrode 130, the edge portion of the top face 140a of the optical waveguide 140 can be arranged close to the length s1 from the edge portion of the aperture region. A width W102 of the top face 140a of the optical waveguide 140 is determined by subtracting double the predetermined interval s1 from the interval ORL102 between the two contour sides ORS101 and ORS102.

More specifically, assuming that the taper angle of the side face 140c of the optical waveguide 140 is set to a predetermined angle, a dead space DS101 defined by the two lines 131a and 131b is a hatched region shown in FIG. 5. A dead space DS103 defined by the gate electrode 130 is also the hatched region shown in FIG. 5. Since the dead space DS101 defined by the two lines 131a and 131b and the dead space DS103 defined by the gate electrode 130 can coincide with each other, a wasteful space can be reduced. The width W102 of the top face 140a of the optical waveguide 140 in the y direction can be increased to the boundary of the dead space DS101. The interval between each of the contour sides ORS103 and ORS104, which extend along the second direction, and the bottom face 140b of the optical waveguide 140 becomes smaller than that between each of the contour sides ORS101 and ORS102 in the first direction and the bottom face 140b of the optical waveguide 140 when viewed from a direction perpendicular to the light receiving surface 11a.

In this manner, in the cross section along the y direction, the gate electrode 130 can overlap the light receiving surface 11a of the photoelectric conversion unit 11 by the predetermined length OL1, suppressing a decrease in efficiency at which charges are transferred from the photoelectric conversion unit to the charge-voltage converter. In addition, the aperture (area of the top face 140a) of the entrance of the optical waveguide 140 can be increased, suppressing a decrease in the quantity of light reaching the photoelectric conversion unit 11. Accordingly, while a decrease in efficiency at which charges are transferred from the photoelectric conversion unit to the charge-voltage converter can be suppressed, a decrease in efficiency at which incident light reaches the light receiving surface of the photoelectric conversion unit can be suppressed.

Figure 6:
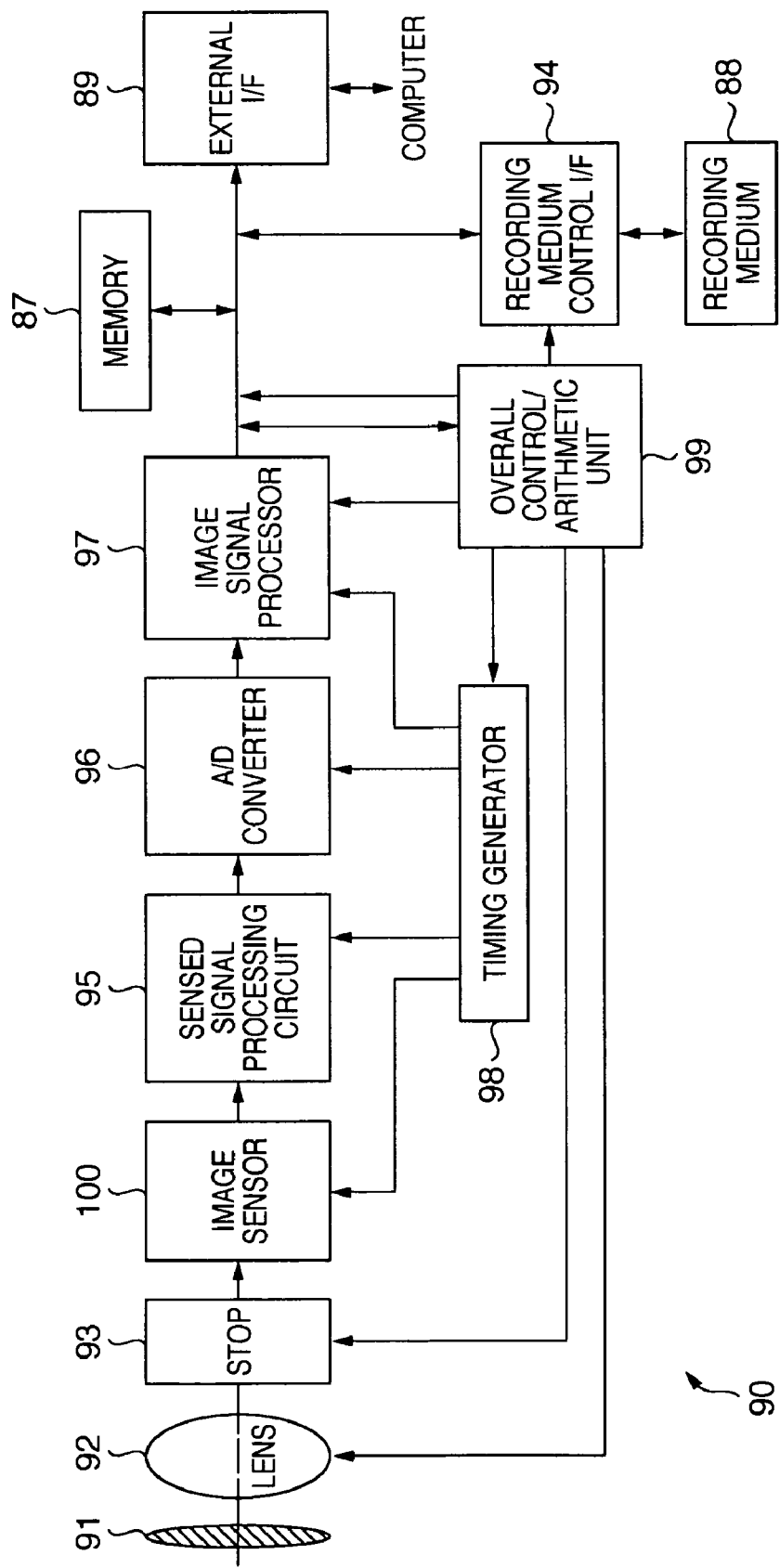
FIG. 6 is a block diagram showing the arrangement of an image sensing apparatus to which the image sensor according to the first embodiment is applied.

FIG. 6 shows an example of an image sensing apparatus to which the image sensor according to the present invention is applied.

As shown in FIG. 6, an image sensing apparatus 90 mainly includes an optical system, the image sensor 100, and a signal processing unit. The optical system mainly includes a shutter 91, lens 92, and stop 93. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88.

The shutter 91 is arranged in front of the lens 92 on the optical path to control the exposure.

The lens 92 refracts incident light to form an object image on the pixel array (image sensing surface) of the image sensor 100.

The stop 93 is interposed between the lens 92 and the image sensor 100 on the optical path. The stop 93 adjusts the quantity of light guided to the image sensor 100 after passing through the lens 92.

The image sensor 100 converts an object image formed on the pixel array into an image signal. The image sensor 100 reads out the image signal from the pixel array, and outputs it.

The sensed signal processing circuit 95 is connected to the image sensor 100, and processes an image signal output from the image sensor 100.

The A/D converter 96 is connected to the sensed signal processing circuit 95. The A/D converter 96 converts a processed image signal (analog signal) output from the sensed signal processing circuit 95 into an image signal (digital signal).

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., a personal computer) via the external I/F 89.

The timing generator 98 is connected to the image sensor 100, sensed signal processing circuit 95, A/D converter 96, and image signal processor 97. The timing generator 98 supplies timing signals to the image sensor 100, sensed signal processing circuit 95, A/D converter 96, and image signal processor 97. The image sensor 100, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the image sensor 100 can provide a high-quality image (image data) as long as it can obtain a high-quality image signal.

Figure 7:
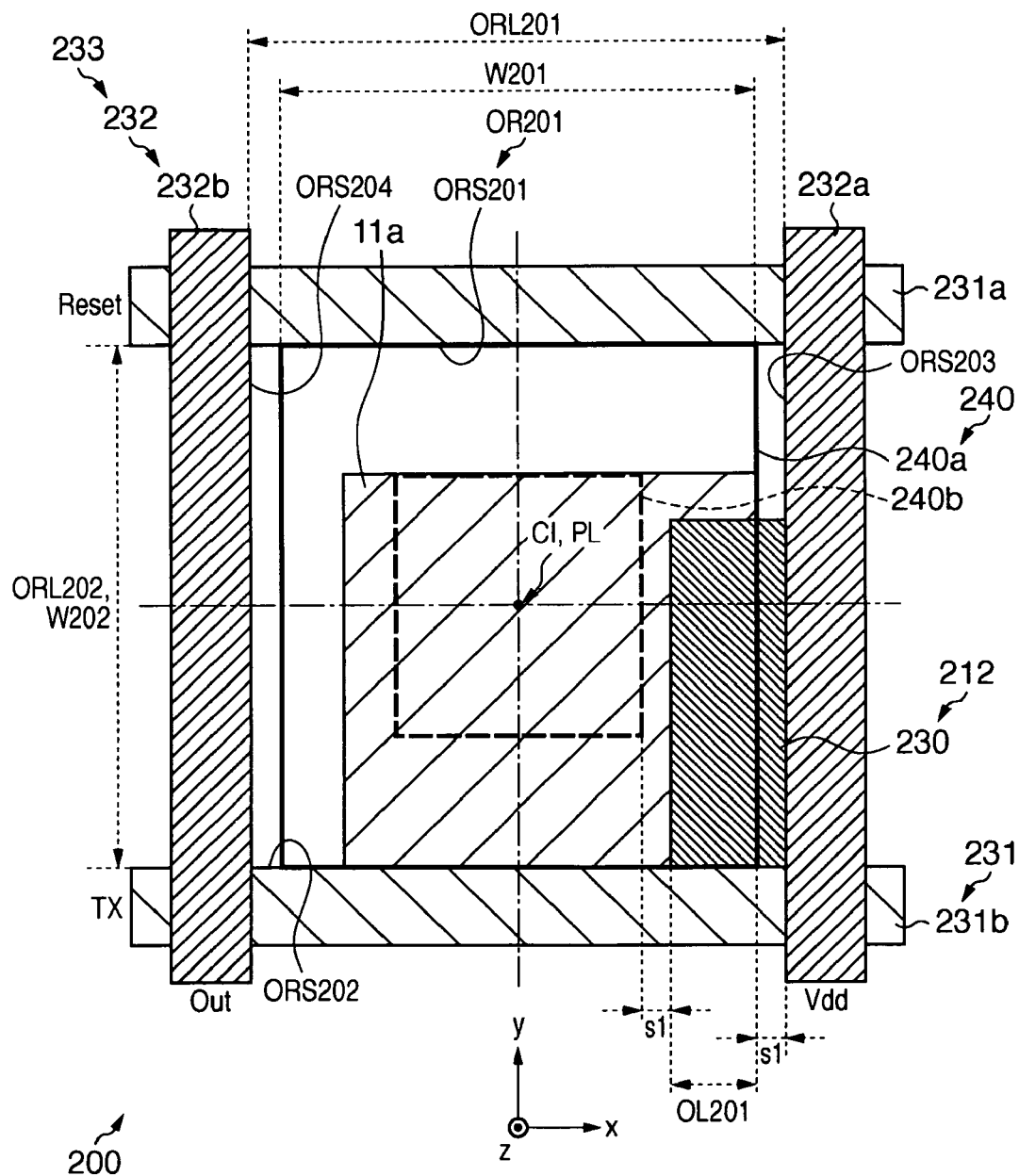
FIG. 7 is a plan view showing the layout of each pixel in the pixel array of an image sensor 200 according to the second embodiment of the present invention.
Figure 8:
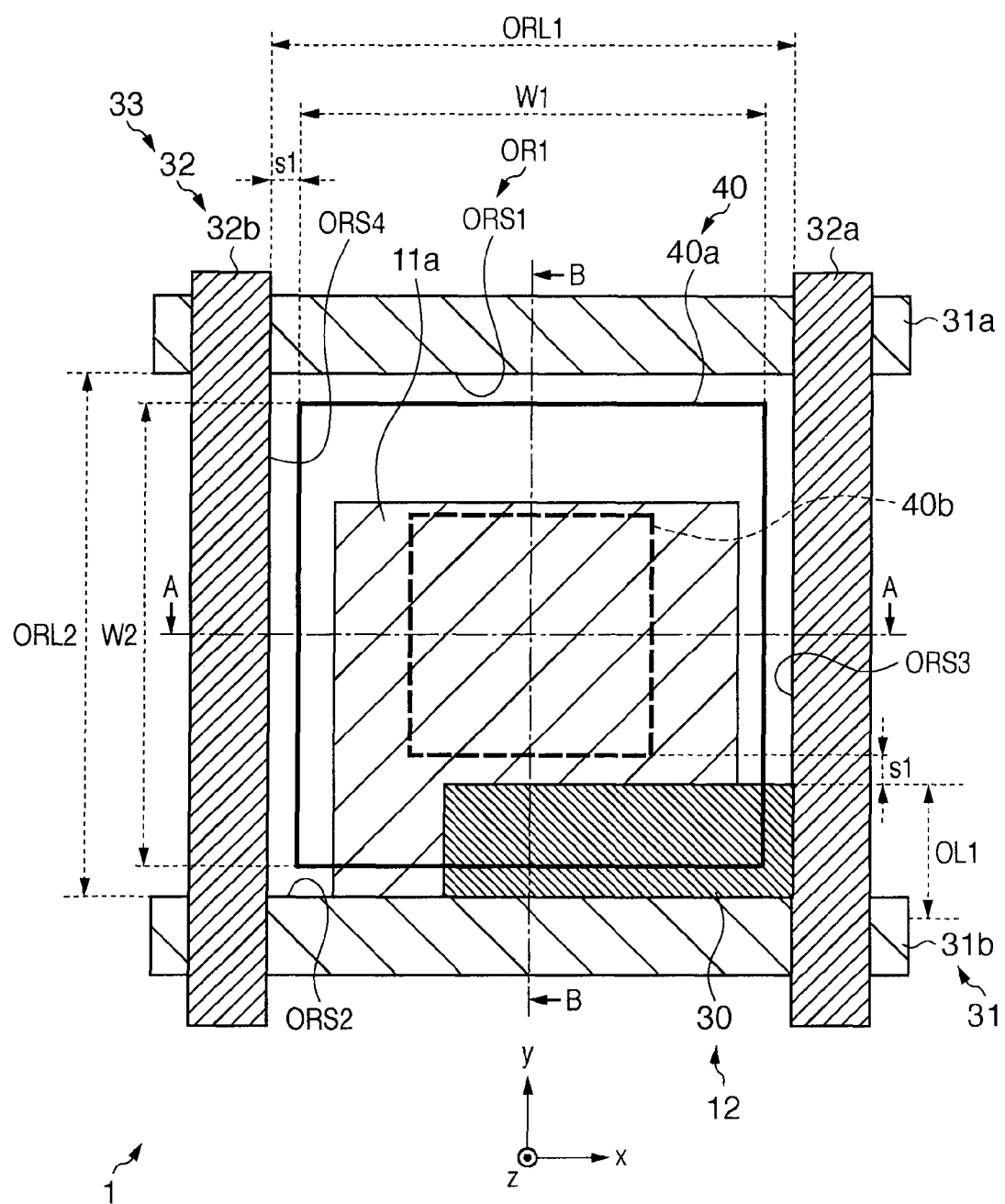
FIG. 8 is a plan view for explaining problems to be solved by the present invention.
Figure 9:
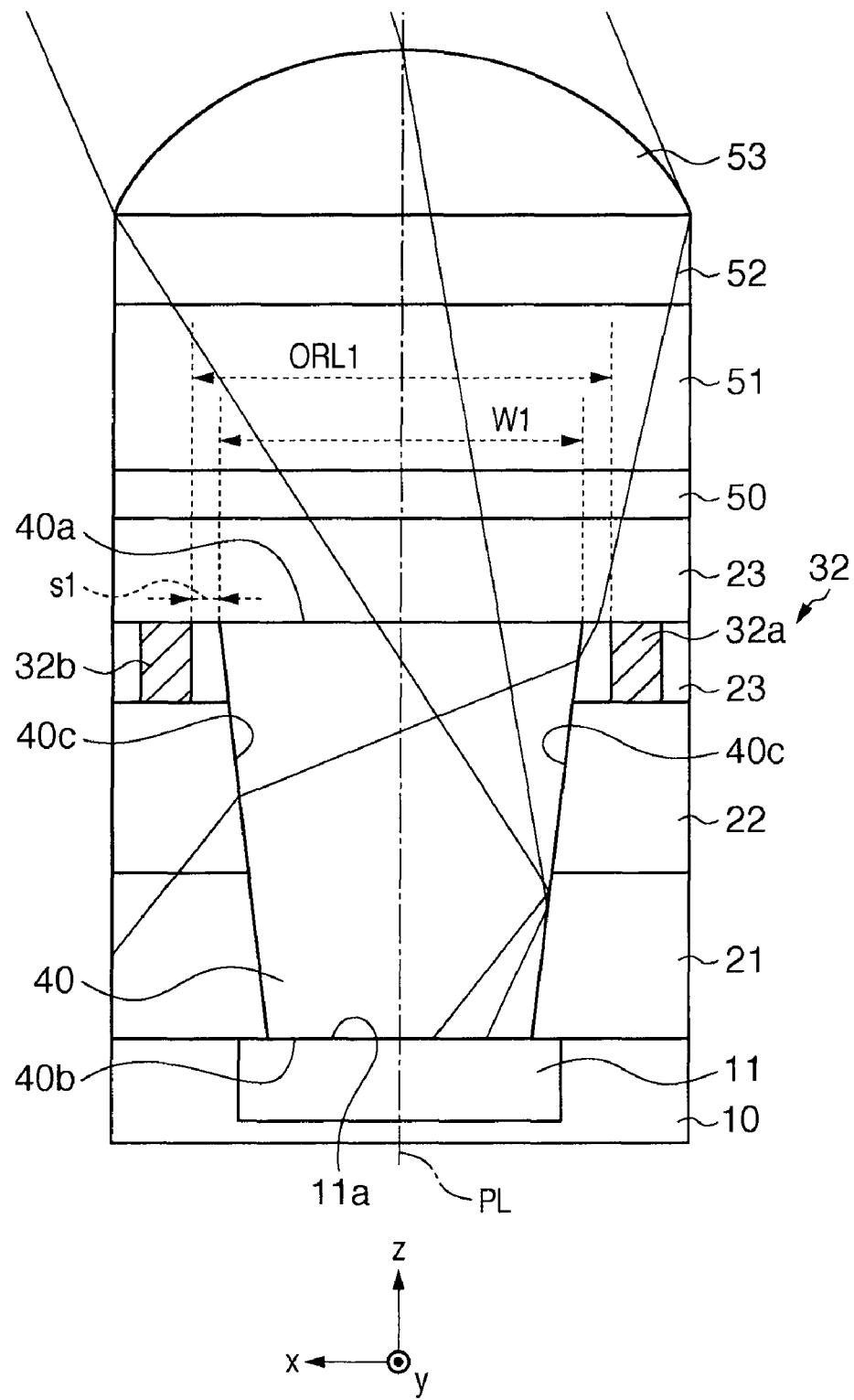
FIG. 9 is a sectional view for explaining problems to be solved by the present invention.
Figure 10:
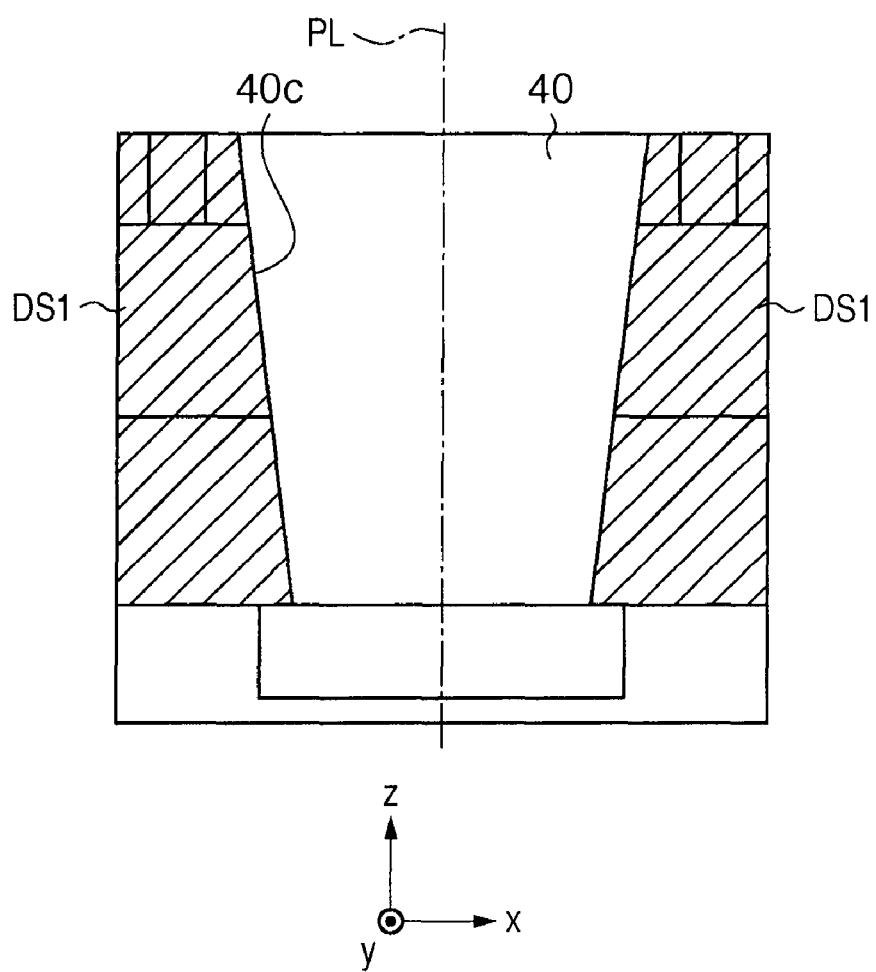
FIG. 10 is a sectional view for explaining problems to be solved by the present invention.
Figure 11:
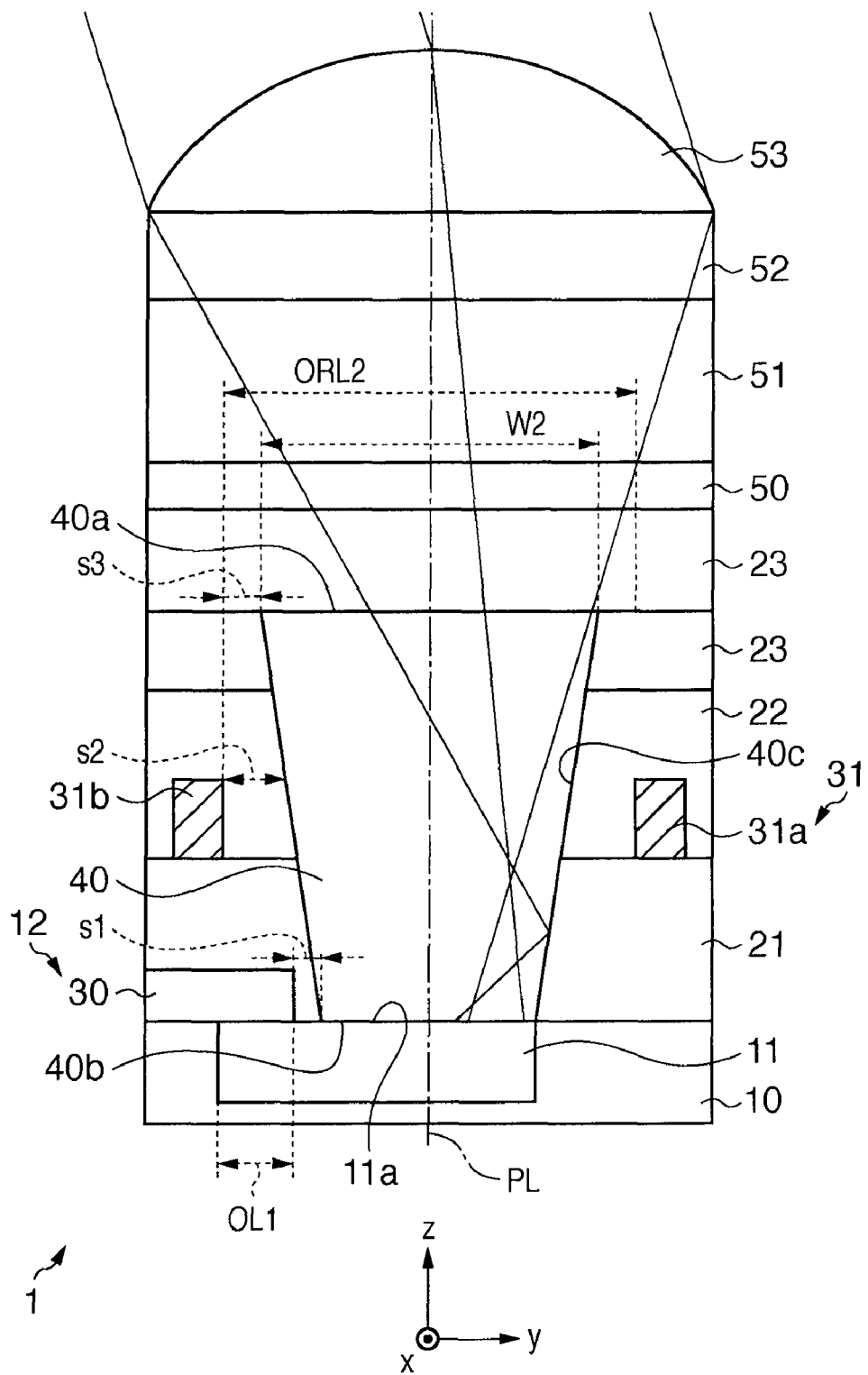
FIG. 11 is a sectional view for explaining problems to be solved by the present invention.
Figure 12A:
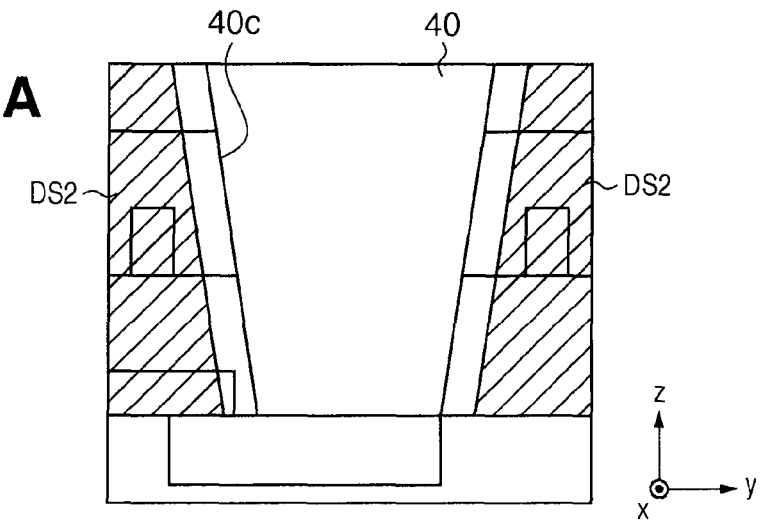
FIGS. 12A to 12C are sectional views for explaining problems to be solved by the present invention.
Figure 12B:
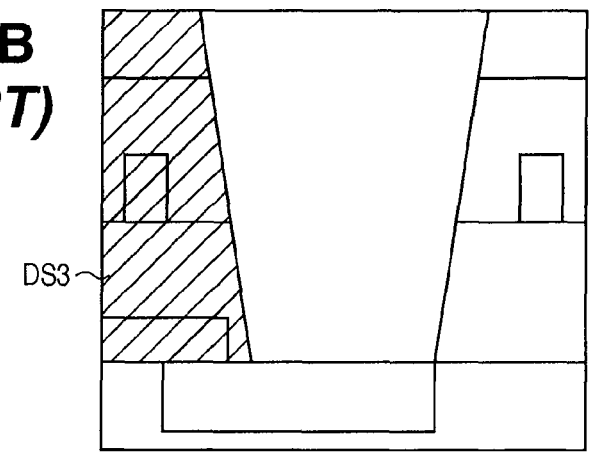
Figure 12C:
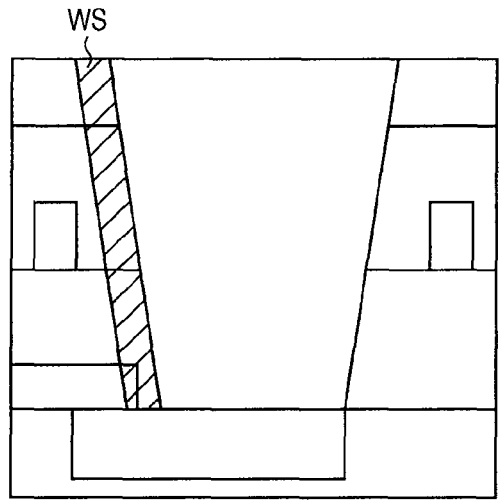

An image sensor 200 according to the second embodiment of the present invention will be explained with reference to FIG. 7. FIG. 7 is a plan view showing the layout of the image sensor 200 according to the second embodiment of the present invention. A difference from the first embodiment will be mainly explained, and a description of the same part will not be repeated.

A multilayer wiring structure 233 includes a second wiring layer 231 instead of the first wiring layer 131, and a first wiring layer 232 instead of the second wiring layer 132.

The first wiring layer 232 is an uppermost wiring layer, and defines two contour sides ORS203 and ORS204 of an aperture region in the y direction (first direction). The first wiring layer 232 includes a power supply line 232a and column signal line 232b.

The second wiring layer 231 is arranged between a gate electrode 230 and the first wiring layer 232 along a normal PL (when viewed in the cross section). The second wiring layer 231 defines two contour sides ORS201 and ORS202 of the aperture region in the x direction (second direction). The second wiring layer 231 includes a reset control line 231a and transfer control line 231b.

The gate electrode 230 of a transfer transistor 212 is decentered in a +x direction from a center C1 of an aperture region OR201. To efficiently transfer charges generated in a photoelectric conversion unit 11 to a charge-voltage converter, the gate electrode 230 and a light receiving surface 11a of the photoelectric conversion unit 11 need to overlap each other by a predetermined area or more.

Assume that it is required to make the gate electrode 230 overlap the light receiving surface 11a of the photoelectric conversion unit 11 by a predetermined length OL201 in the x direction, in order to increase the efficiency at which charges are transferred from the photoelectric conversion unit 11 to the charge-voltage converter. In this case, the edge portion of a bottom face 240b of an optical waveguide 240 needs to be positioned closer to the normal PL by a predetermined length s1 than the gate electrode 230 in order to ensure the manufacturing margin.

Even in this case, the gate electrode 230 is arranged so that its longitudinal direction (its channel width direction) is along a direction in which the uppermost wiring layer extends, that is, the first direction (y direction). The gate electrode 230 is arranged at a position where it overlaps the first wiring layer 232 when viewed from a direction perpendicular to the light receiving surface 11a. Thus, even if the edge portion of the bottom face 240b of the optical waveguide 240 is positioned closer to the normal PL by the predetermined length s1 than the gate electrode 230 in the x direction, the edge portion of a top face 240a of the optical waveguide 240 can be arranged close to the length s1 from the edge portion of the aperture region. A width W201 of the top face 240a of the optical waveguide 240 is determined by subtracting double the predetermined interval s1 from the interval ORL201 between the two contour sides ORS203 and ORS204.

More specifically, assuming that the taper angle of the side face of the optical waveguide 240 is set to a predetermined angle, a dead space defined by two lines 232a and 232b of the first wiring layer 232 is a region identical to the hatched region shown in FIG. 5. A dead space defined by the gate electrode 230 is also a region identical to the hatched region shown in FIG. 5. Since the dead space defined by the two lines 232a and 232b and that defined by the gate electrode 230 can coincide with each other, a wasteful space can be reduced. The width W201 of the top face 240a of the optical waveguide 240 can be increased to the boundary of the dead space.

As described above, in the cross section along the x direction, the gate electrode 230 can overlap the light receiving surface 11a of the photoelectric conversion unit 11 by the predetermined length OL201, suppressing a decrease in efficiency at which charges are transferred from the photoelectric conversion unit to the charge-voltage converter. Also, the aperture (area of the top face 240a) of the entrance of the optical waveguide 240 can be increased, suppressing a decrease in the quantity of light reaching the photoelectric conversion unit 11. As a result, while a decrease in efficiency at which charges are transferred from the photoelectric conversion unit to the charge-voltage converter can be suppressed, a decrease in efficiency at which incident light reaches the light receiving surface of the photoelectric conversion unit can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-117627, filed Apr. 28, 2008, which is hereby incorporated by reference herein in its entirety.

What is claimed is:

1. An image sensor comprising:
   a photoelectric conversion unit having a light receiving surface;
   a transfer transistor which has a gate electrode and transfers charges generated in the photoelectric conversion unit to a charge-voltage converter;
   a multilayer wiring structure which defines an aperture region above the photoelectric conversion unit; and
   a waveguide which guides light entering the aperture region to the light receiving surface,
   wherein the multilayer wiring structure includes
      a first wiring layer which is an uppermost wiring layer and defines two contour sides of the aperture region in a first direction, and
      a second wiring layer which is arranged between the gate electrode and the first wiring layer in a direction perpendicular to the light receiving surface, and defines two contour sides of the aperture region in a second direction, and
   wherein the gate electrode is arranged to overlap part of the light receiving surface and have a longitudinal direction along the first direction.

2. The sensor according to claim 1, wherein
   the waveguide includes a top face arranged between the two contour sides in the first direction, and a bottom face arranged at a position where the bottom face does not overlap the gate electrode within the top face, when viewed from a direction perpendicular to the light receiving surface, and
   the gate electrode is arranged at a position where the gate electrode overlaps the first wiring layer when viewed from the direction perpendicular to the light receiving surface.

3. The sensor according to claim 2, wherein
   the first wiring layer includes a transfer control line for supplying a transfer signal to the transfer transistor, and
   the gate electrode is connected to the transfer control line at a position where the gate electrode overlaps the transfer control line when viewed from the direction perpendicular to the light receiving surface.

4. The sensor according to claim 2, wherein
   an interval between each contour side along the second direction and the bottom face is smaller than an interval between each contour side along the first direction and the bottom face when viewed from the direction perpendicular to the light receiving surface.

5. The sensor according to claim 2, wherein
   the waveguide further includes a side face tapered from an edge portion of the top face to an edge portion of the bottom face to come close to a normal passing through a center of the aperture region.

6. An image sensing apparatus comprising:
   an image sensor defined in claim 1;
   an optical system which forms an image on an image sensing surface of the image sensor; and
   a signal processing unit which processes a signal output from the image sensor to generate image data.

* * * * *